United States Patent
Kadiwala et al.

(10) Patent No.: US 10,531,180 B2
(45) Date of Patent: Jan. 7, 2020

(54) FEED-FORWARD, FILTER-BASED, ACOUSTIC CONTROL SYSTEM

(71) Applicant: MOTOROLA MOBILITY LLC, Chicago, IL (US)

(72) Inventors: Sanjay N. Kadiwala, Roselle, IL (US); Jonathan E. Eklund, Libertyville, IL (US)

(73) Assignee: Motorola Mobility LLC, Chicago, IL (US)

( * ) Notice: Subject to any disclaimer, the term of this patent is extended or adjusted under 35 U.S.C. 154(b) by 0 days.

(21) Appl. No.: 15/947,252

(22) Filed: Apr. 6, 2018

(65) Prior Publication Data
US 2019/0313180 A1  Oct. 10, 2019

(51) Int. Cl.
| H04R 1/22 | (2006.01) |
| H04R 3/04 | (2006.01) |
| H04R 1/10 | (2006.01) |
| H03G 5/16 | (2006.01) |
| H04R 3/00 | (2006.01) |

(52) U.S. Cl.
CPC ............. H04R 1/22 (2013.01); H03G 5/165 (2013.01); H04R 1/10 (2013.01); H04R 3/04 (2013.01); H04R 3/007 (2013.01); H04R 2430/01 (2013.01)

(58) Field of Classification Search
CPC ... H04R 1/22; H04R 1/10; H04R 3/04; H04R 2430/01; H03G 5/165
See application file for complete search history.

(56) References Cited

U.S. PATENT DOCUMENTS

| 6,011,853 | A  * | 1/2000  | Koski    | H04L 1/20 381/103 |
| 6,651,040 | B1 * | 11/2003 | Bakis    | G10L 15/02 381/107 |
| 2002/0090096 | A1 * | 7/2002 | Blind    | H03G 7/06 381/104 |
| 2005/0282590 | A1 * | 12/2005 | Haparnas | H04M 19/044 455/570 |
| 2007/0003078 | A1 * | 1/2007 | Escott   | H03G 7/007 381/107 |

(Continued)

FOREIGN PATENT DOCUMENTS

WO  WO-0001196 A1 * 1/2000 ........... H04R 25/353

Primary Examiner — Davetta W Goins
Assistant Examiner — Kuassi A Ganmavo
(74) Attorney, Agent, or Firm — Yudell Isidore PLLC

(57) ABSTRACT

An electronic device, method, and computer program product provide acoustic limiting of an audio output using a feed-forward, filter-based, acoustic control system. An audio signal is received that has more than one acoustic frequency spectra intended for conversion to an acoustic output by transducers of an electronic device. A determination is made of an expected acoustic magnitude respectively for each acoustic frequency spectrum of the more than one acoustic frequency spectra. A determination is made whether the expected acoustic magnitude of any acoustic frequency spectra will exceed an acoustic output threshold. The acoustic control system attenuates the first acoustic frequency spectrum to generate a filtered audio signal with an attenuated acoustic frequency spectrum that is less than or equal to the acoustic output threshold. The filtered audio signal is transmitted to the at least one transducer to the produce the audio output that does not exceed.

19 Claims, 9 Drawing Sheets

(56) References Cited

U.S. PATENT DOCUMENTS

| | | | |
|---|---|---|---|
| 2009/0092265 A1* | 4/2009 | Lovejoy | G10L 21/02 381/107 |
| 2009/0240497 A1* | 9/2009 | Usher | H04R 1/10 704/235 |
| 2010/0131749 A1* | 5/2010 | Kim | H04M 1/6016 713/100 |
| 2013/0101125 A1* | 4/2013 | Peters | H04M 1/6016 381/56 |
| 2013/0316686 A1* | 11/2013 | Subbaramoo | H04W 8/22 455/418 |

* cited by examiner

FEED-FORWARD, FILTER-BASED, ACOUSTIC CONTROL SYSTEM

BACKGROUND

1. Technical Field

The present disclosure relates generally to acoustic control of an electronic device, and in particular to an automatic acoustic volume control system that limits an output sound pressure level of an electronic device.

2. Description of the Related Art

Electronic devices often provide for a range of uses with many types of communication channels and audio playback. These uses can be both handheld and hands free. Audio playback systems of electronic devices are increasingly designed to produce high sound pressure output levels. In contrast to earpiece audio output levels for traditional handheld phone usage, these high sound pressure levels are sufficient to be used as a primary method of outputting multimedia content and for hands free communication. Although loudspeaker mode may be often in use, there are still instances in which a user may choose to place the electronic device close to the user's ear. Even when volume is set to a low level for such use, certain applications can be enabled to automatically alert the user with audible tones or spoken information that is overlaid on a current source of audio output. The combination of sources of audio output and operational modes of the electronic device can exceed an acoustic output limit desirable for ear coupled listening.

BRIEF DESCRIPTION OF THE DRAWINGS

The description of the illustrative embodiments is to be read in conjunction with the accompanying drawings, wherein.

DETAILED DESCRIPTION

Figure 1:
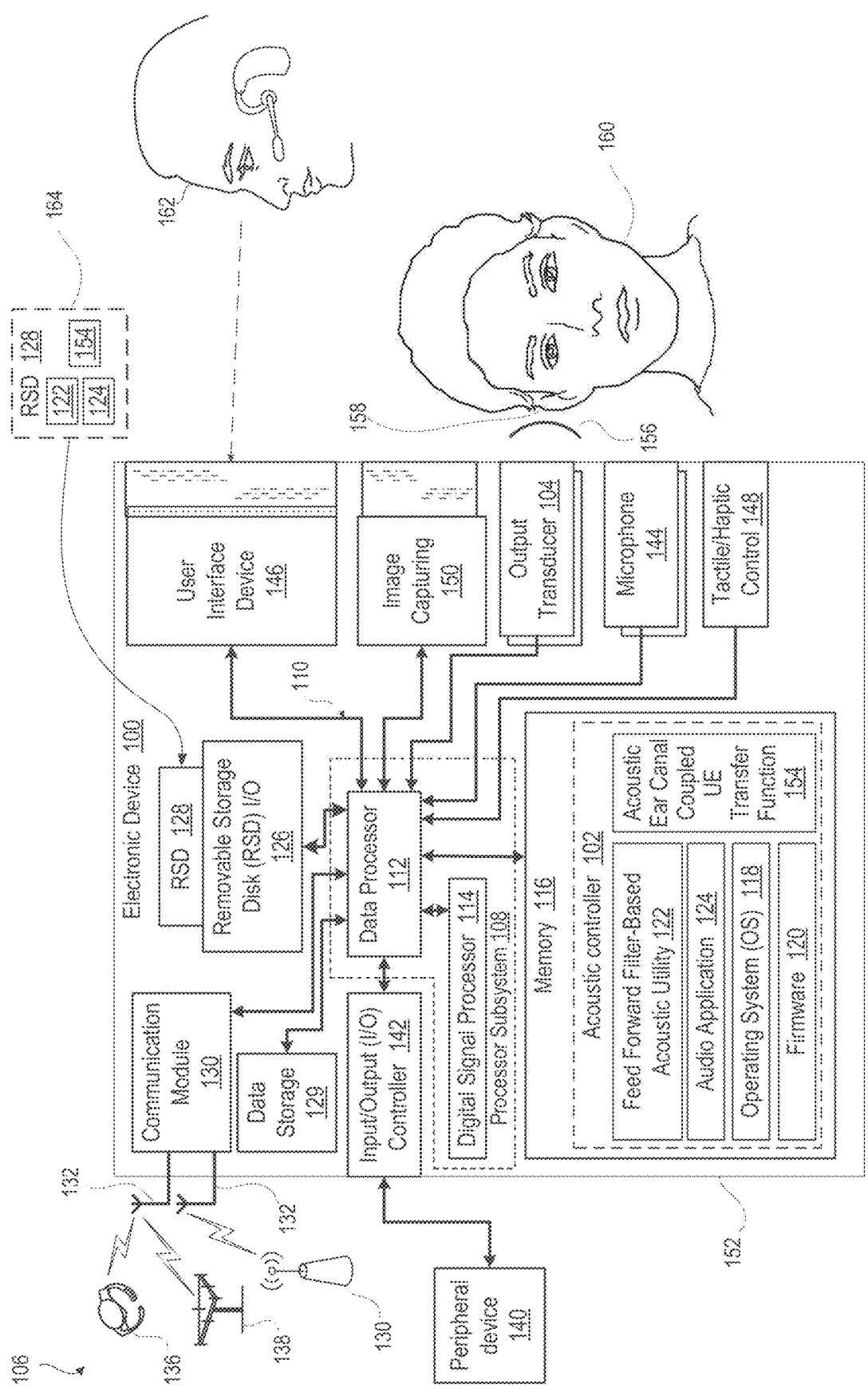
FIG. 1 provides a simplified block diagram of an electronic device having an acoustic control system with which certain aspects of the disclosure can be practiced, in accordance with one or more embodiments.

According to aspects of the present disclosure, a method is provided of acoustic limiting of an audio output of an electronic device using a feed-forward, filter-based, acoustic control system. In one or more embodiments, the method includes receiving, by an audio control system, an audio signal having more than one acoustic frequency spectra. The audio signal is produced for conversion to an acoustic output by one or more transducer(s) of the electronic device. An expected acoustic magnitude is determined respectively for each one of the more than one acoustic frequency spectra. The expected acoustic magnitude is based on a predetermined acoustic conversion characteristic of the transducer(s) and based on the audio signal. The method includes determining whether the expected acoustic magnitude of any of the more than one acoustic frequency spectra will exceed an acoustic output threshold. In response to determining that a first acoustic frequency spectrum of the more than one acoustic frequency spectrum will exceed the acoustic output threshold, the method includes attenuating the first acoustic frequency spectrum to generate a filtered audio signal with an attenuated acoustic frequency spectrum that is less than or equal to the acoustic output threshold. The filtered audio signal is transmitted to the transducer(s).

According to aspects of the present disclosure, an electronic device has at least one transducer and a memory containing an audio utility and an audio application that produces an audio signal. A processor subsystem of the electronic device is in communication with the memory and the transducer(s). The processor subsystem executes the audio application and the acoustic utility. The audio application produces and the acoustic utility receives an audio signal having more than one acoustic frequency spectra. After any filtering controlled by the acoustic utility, the audio signal is converted to an acoustic output by the transducer(s) of the electronic device. The processor subsystem determines an expected acoustic magnitude without any additional filtering by the acoustic utility respectively for each one of the more than one acoustic frequency spectra, based on a predetermined acoustic conversion characteristic of the transducer(s) and based on the audio signal. The processor subsystem determines whether the expected acoustic magnitude of any of the more than one acoustic frequency spectra will exceed an acoustic output threshold. In response to determining that a first acoustic frequency spectrum of the more than one acoustic frequency spectra will exceed the acoustic output threshold, the processor subsystem attenuates the first acoustic frequency spectrum to generate a filtered audio signal with an attenuated acoustic frequency spectrum that is less than or equal to the acoustic output threshold. The processor subsystem transmits the filtered audio signal to the transducer(s) of the electronic device along with any acoustic frequency spectra that is not attenuated.

According to aspects of the present disclosure, a computer program product includes program code on a computer readable storage device that, when executed by a processor associated with an electronic device, the program code enables the electronic device to provide the functionality of the aforementioned method.

In the following detailed description of exemplary embodiments of the disclosure, specific exemplary embodiments in which the various aspects of the disclosure may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present disclosure. The following detailed description is, therefore, not to be taken in a limiting sense, and the scope of the present disclosure is defined by the appended claims and equivalents thereof. Within the descriptions of the different views of the figures, similar elements are provided similar names and reference numerals as those of the previous figure(s). The specific numerals assigned to the elements are provided solely to aid in the description and are not meant to imply any limitations (structural or functional or otherwise) on the described embodiment. It will be appreciated that for simplicity and clarity of illustration, elements illustrated in the figures have not necessarily been drawn to scale. For example, the dimensions of some of the elements may be exaggerated relative to other elements.

It is understood that the use of specific component, device and/or parameter names, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

As further described below, implementation of the functional features of the disclosure described herein is provided within processing devices and/or structures and can involve use of a combination of hardware, firmware, as well as several software-level constructs (e.g., program code and/or program instructions and/or pseudo-code) that execute to provide a specific utility for the device or a specific functional logic. The presented figures illustrate both hardware components and software and/or logic components.

Those of ordinary skill in the art will appreciate that the hardware components and basic configurations depicted in the figures may vary. The illustrative components are not intended to be exhaustive, but rather are representative to highlight essential components that are utilized to implement aspects of the described embodiments. For example, other devices/components may be used in addition to or in place of the hardware and/or firmware depicted. The depicted example is not meant to imply architectural or other limitations with respect to the presently described embodiments and/or the general invention.

The description of the illustrative embodiments can be read in conjunction with the accompanying figures. Embodiments incorporating teachings of the present disclosure are shown and described with respect to the figures presented herein.

Turning now to FIG. 1, there is depicted a block diagram representation of an example user device 100 having an acoustic control system ("acoustic controller") 102. Acoustic controller 102 implements several of the features of the disclosure to limit an acoustic output of output transducer(s) 104 of user device 100.

In one or more embodiments, user device 100 incorporates wireless communication capabilities to operate as a wireless user device. User device 100 can be one of a host of different types of devices, including but not limited to, a mobile cellular phone or smart-phone, a laptop, a net-book, an ultra-book, a networked smart watch or networked sports/exercise watch, and/or a tablet computing device or similar device that can include wireless communication functionality. As a device supporting wireless communication, user device 100 can be one of, and also be referred to as, a system, device, subscriber unit, subscriber station, mobile station (MS), mobile, mobile device, remote station, remote terminal, user terminal, terminal, user agent, user device, cellular telephone, a satellite phone, a cordless telephone, a Session Initiation Protocol (SIP) phone, a wireless local loop (WLL) station, a personal digital assistant (PDA), a handheld device having wireless connection capability, a computing device, or other processing devices connected to a wireless modem. These various devices all provide and/or include the necessary hardware and software to support the various wireless or wired communication functions as part of a communication system 106. User device 100 can also be an over-the-air link in communication system 106 that can be intended to be portable or hand-held or for which a user can move into close proximity. Examples of such user devices include a wireless modem, an access point, a repeater, a wirelessly-enabled kiosk or appliance, a femtocell, a small coverage area node, and a wireless sensor, etc.

Referring now to the specific component makeup and the associated functionality of the presented components, user device 100 includes processor subsystem 108. Processor subsystem 108 can be an integrated circuit (IC) that connects, via a plurality of bus interconnects 110, to a plurality of functional components of user device 100, such as output transducer(s) 104. Processor subsystem 108 can include one or more programmable microprocessors, such as data processor 112 and digital signal processor (DSP) 114 of processor subsystem 108, which may both be integrated into a single processing device, in some embodiments. Processor subsystem 108 controls the communication, user interface, and other functions and/or operations of user device 100. These functions and/or operations thus include, but are not limited to, application data processing and signal processing. User device 100 may use hardware component equivalents for processor subsystem 108 such as special purpose hardware, dedicated processors, general purpose computers, microprocessor-based computers, micro-controllers, optical computers, analog computers, dedicated processors and/or dedicated hard wired logic. Connected to processor subsystem 104 is memory 116, which can include volatile memory and/or non-volatile memory. Memory 116 stores software instructions or program code (collectively "software") that, when executed by the processor subsystem 108, can provide the functionality of acoustic controller 102. The software can include an operating system 118, as well as firmware 120. One or more other executable applications, such as an acoustic utility 122 that is feed forward and filter based and an audio application 124, can be stored within memory 116 for execution by processor subsystem 108. Also connected to processor subsystem 108 is removable storage device (RSD) input/output (I/O) interface 126 that receives a RSD 128 for additional storage. Memory 116 may be augmented by on-device data storage 129.

According to the illustrative embodiment, user device 100 supports wireless communication via communication module 130. Communication module 130 transceives at selected frequencies and protocols over an antenna array 132. For example, user device 100 may support communication protocols and transceiver radio frequencies appropriate for a wireless local area network (WLAN), illustrated as node 134. User device 100 can communicate over a personal access network (PAN) with devices such as a smart watch 136. User device 100 can communicate with a radio access network (RAN) 138 that is part of a wireless wide area network (WWAN). In certain embodiments, user device 100 may also support communication with a hardwired local access network (LAN) (not shown) or peripheral devices 140 via an I/O controller 142. In one or more embodiments, user device 100 can be a distributed system of wireless or wired links or a component subsystem incorporated into a larger assembly or system.

User device 100 includes input and output devices. For example, microphone 144 receives user audible inputs. User interface device 146 can present visual or tactile outputs as well as receive user inputs. In one example, user interface device 146 can include a touch screen that is embedded within or associated with a display. Output transducer(s) 104, such as an audio speaker, can augment or provide alternate presentation of the visual or tactile outputs of user interface device 146 as well as providing audio playback and alerts. A tactile/haptic control 148 can provide an interface such as for braille reading or manual inputs. An image capturing device 150, such as a camera, can receive gestures and other image data. User device 100 can be wholly or substantially encompassed by an enclosure 152.

According to one aspect, acoustic controller 102 can adjust control settings to reflect hardware limitations of the output transducer(s) 104 or other aspects of the electronic device 100 by accessing a transfer function 154. Transfer function 154 provides a predetermined acoustic conversion characteristic that includes an expected acoustic output 156 of user device 100 when an ear canal is placed in proximity to the transducer 104 of user device 100. In particular, for a given input audio signal, processor subsystem 108 predicts the expected acoustic audio output 156 presented to an ear 158 of user 160 that is in close proximity. In other instances, acoustic controller 102 detects an operational context of user device 100 to determine that a user 162 is at a determinable distance from user device 100. User experience is maintained by attenuating only particular frequency spectra that exceed a preset output limit when an applicable use case is determined. The other frequency spectra can be maintained at the expected amplitude for achieving perceived quality of the audio output. Acoustic controller 102 can also determine an operational context where loudness over perceived quality is warranted and can then amplify the other frequency spectra closer to the preset output limit.

According to one embodiment, computer program product 164 comprises RSD 126 containing a copy of acoustic utility 122, audio application 124, and transfer function 154. Computer program product 164 can provision the electronic device 100 with the software components of acoustic controller 102. When executed by user device 100. Acoustic controller 102 receives an audio signal that is being processed by processor subsystem 108, such as from audio application 124. The audio signal has more than one acoustic frequency spectra intended for conversion to an acoustic output by transducers 104 of user device 100. Acoustic controller 102 determines an expected acoustic magnitude respectively for each acoustic spectrum of the acoustic frequency spectra. Acoustic controller 102 determines whether the expected acoustic magnitude of any of the more than one acoustic frequency spectra will exceed an acoustic output threshold. In response to determining that at least one acoustic frequency spectra (e.g., a first acoustic frequency spectrum) of the more than one acoustic frequency spectra will exceed the acoustic output threshold, acoustic controller 102 attenuates the corresponding acoustic frequency spectrum to generate a filtered audio signal with an attenuated acoustic frequency spectrum that is less than or equal to the acoustic output threshold. No change is made to the second acoustic frequency spectrum of the more than one acoustic frequency spectra that do not exceed the acoustic output threshold. Acoustic controller 102 transmits the filtered audio signal along with the unchanged second acoustic frequency spectrum to the transducer(s) 104.

In one or more embodiments, the predetermined acoustic conversion characteristic is obtained empirically or deterministically by an original equipment manufacturer (OEM) for each type of user device 100. In one or more embodiments, acoustic controller 102 can perform a configuration mode in which a test audio signal is transmitted to the transducer(s) 104 and detected by microphone(s) 144. Transfer function 154 relates the detected audio output to the test audio signal. In one or more embodiments, acoustic controller 102 attenuates the first acoustic frequency spectrum in response to detecting an operational transition of the electronic device from earpiece mode to loudspeaker mode. Acoustic controller 102 can perform this attenuation during a transition period. The transition period provides an opportunity for a user to recognize an increasing volume and to have sufficient time to move away from close proximity to the electronic device 100. During the transition period, acoustic controller 102 starts and monitors an acoustic timer having an expiration time. Acoustic controller 102 can initially impose a reduction in a flat volume gain and incrementally, continuously, or periodically increase the flat volume gain during the transition period until reaching a target flat volume gain, such as a preset loudspeaker volume.

Acoustic controller 102 thus goes beyond merely implementing loudness equalization, such as approaches based on the Fletcher-Munson Equal loudness contours. The filter shape is created based on a weighted function limit, and pre-clips to that limit. The present innovation contemplates that micro-acoustic systems are generally not capable of achieving true equal loudness across the bandwidth of operation because of physical transducer size limitations. In general, the loudness curves also do not take into account the specific application of ear-coupling of the acoustic port at 13 Newtons (N) and that the ear canal resonance effect is present.

Acoustic controller 102 thus goes beyond merely switching between earpiece (EP) and loudspeaker (LS) mode in a single-transducer design. Such EP-LS transition only involves changing a gain profile and application of weighting with no time dependence to a constant, pre-defined target mask that does not change as a function of volume step. The present innovation enhances the transition from simple gain-based step-change between LS/EP transitions. In one or more embodiments, the enhancement provides a smoother transition with sounds that gradually fade and change.

Acoustic controller 102 can provide for compliance with an acoustic output limit while enhancing user experience and functionality of user device 100. For example, a flat gain reduction across the frequency spectra to avoid exceeding the acoustic output limit would not address situations where the resulting loudness is too low to alert a user. A ring tone for an incoming call that triggered the transition could be missed. In some instances, inadequate loudness could be provided by certain frontal ported hardware designs, especially those with multiple transducers. Thus, according one aspect, acoustic controller 102 controls the ramping of high audio volumes, such as a ringtone, using a feed forward system based on a priori measurements of user device 100 in the loaded case for various volume levels. The feed forward equalization reduces the level of frequency regions, typically ear resonance regions, when these frequency regions exceed a limit threshold. Thereby, user device 100 allows for maximum perceived loudness while maintaining an appropriate listening level. As the time increases and the ramped volume of user device 100 increases, the equalization changes as well.

Figure 2:
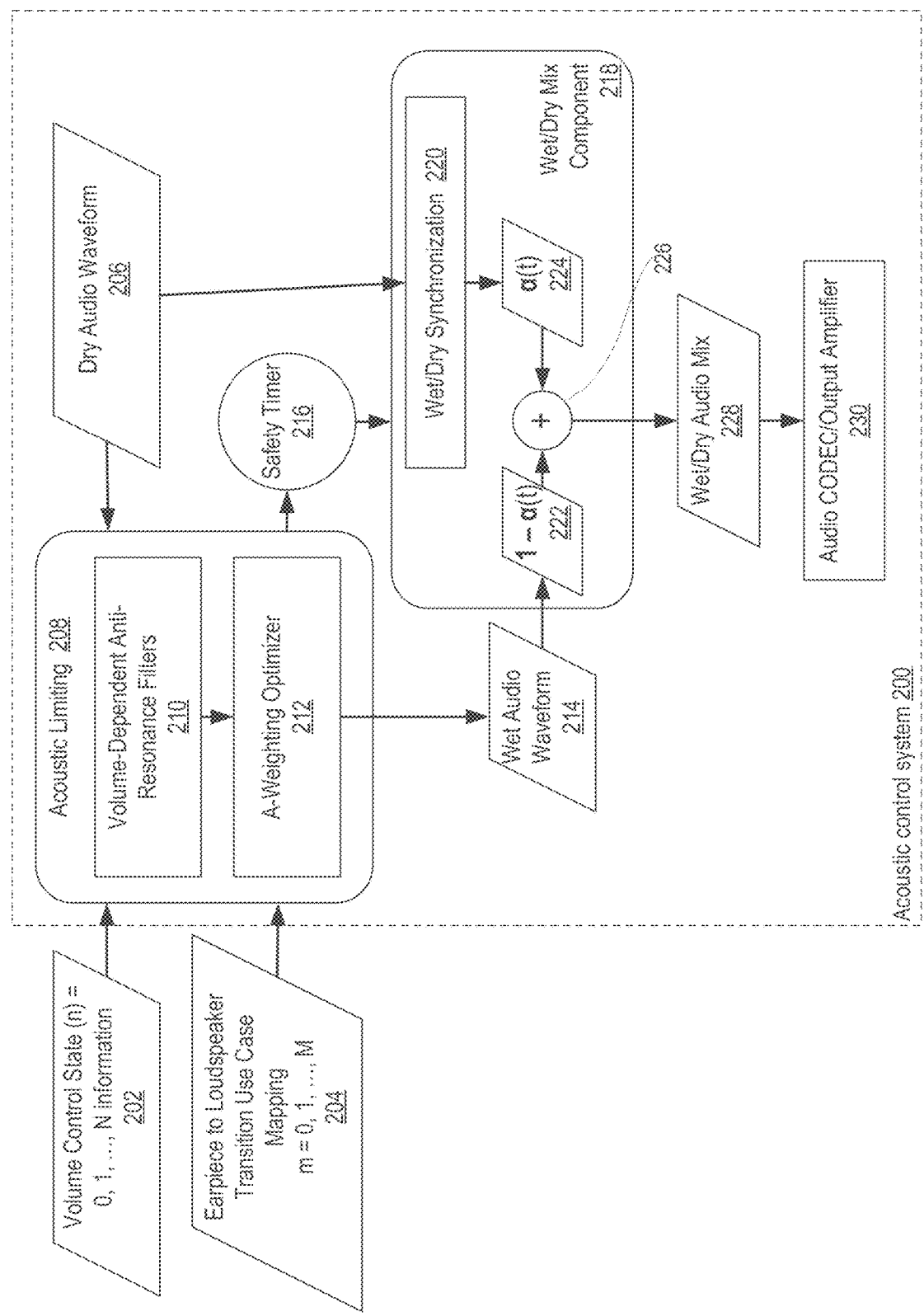
FIG. 2 provides a diagram of an acoustic control system, according to one or more embodiments.

FIG. 2 illustrates an acoustic control system 200 that performs feed-forward filtering of an audio signal to implement an output volume limit. Acoustic control system 200 is an example of acoustic controller 102 (FIG. 1). In one or more embodiments, acoustic control system 200 operates on signal frequency spectrum as analyzed using a Fast Fourier Transform (FFT). Acoustic safety output ramps the audio volume depending on an applicable use case. The ramping affects wet or dry mix of filtered and unfiltered versions of the audio signal that is transmitted to output transducer(s) 104 on user device 100 (FIG. 1). Dry sound signals refers to the raw or unprocessed sounds that usually come from a direct recording. Wet sounds refer to the processed sound/signal. Wet sounds/signals are derived from dry sounds/signals.

Inputs to the acoustic control system 200 include a volume control state information 202 (n)=0, 1, . . . N. The volume control state can include a target volume level. The target volume level can depend on the operational state to which user device 100 (FIG. 1) is transitioning. Use case mapping information 204 is discrete values m=0, 1, . . . , M. In one or more embodiments, the mapping information 204 can include:

(i) m=0, where user device 100 (FIG. 1) is sitting idle and an acoustic limit is not imposed;

(ii) m=1, where user device 100 (FIG. 1) has an incoming call with a ringtone that is to be played and the acoustic limit is to be imposed;

(iii) m=2, where a touchscreen/actuated transition is initiated to switch to speakerphone mode in a call and the acoustic limit is to be imposed;

(iv) m=3, where the operational transition is triggered by manual actuation of multimedia playback and the acoustic limit is not imposed; and (v) m=4, where multimedia playback resumes after a phone call with the acoustic limit imposed.

Other use cases that correlate with a user listening in an ear piece mode can be detected and addressed. The use cases can rely entirely or in part on contextual information that increases or decreases the likelihood that the user's ear is close to an output transducer. For example, if the user is typing on a touch screen of the electronic device 100 (FIG. 1), acoustic control system 200 can determine that the ear of the user is not close to the electronic device. Similarly, the use cases can rely entirely or in part on sensor data that increases or decreases the likelihood that the user's ear is close to an output transducer. For example, if the front camera of the electronic device 100 (FIG. 1) recognizes a face of the user, acoustic control system 200 can determine that the ear of the user is not close to the electronic device. For another example, the use case can be based on a combination of contextual information and sensor data, such as detecting no user interactions with the electronic device 100 (FIG. 1) with accelerometer data detecting that the electronic device 100 (FIG. 1) is stationery.

Rather than relying solely on straight gain or flat attenuation across all frequencies, acoustic control system 200 obtains information of what the resulting output acoustic level will be for an audio waveform 206. By only limiting acoustic output as necessary, acoustic control system 200 allows functionality of audible alerts/ringtone and improves user experience by specifically targeting problematic frequencies when a user's ear is sealed against user device 100 (FIG. 1). Acoustic control system 200 can increase an overall loudness as currently configured without violating an upper limit. In particular, acoustic limiting component 208 performs acoustic limiting based upon volume-dependent anti-resonance filters 210 and an A-weighting optimizer 212. In one or more embodiments, an audio limit for ear coupled use is 13N. At each volume step, anti-resonance filter 210 characterizes the ear canal response for each frequency to achieve anti-resonance. Whether or not acoustic limiting is employed can depend on a detected or determined current use of the electronic device 100 (FIG. 1). A number of use cases can be defined by use case mapping. Processor subsystem 108 (FIG. 1) receives a number of inputs from functional components that can be factors utilized in determining a current use case of the electronic device 100 (FIG. 1). Use case mapping information 204 allows a degree of freedom to differentiate behavior based on expected bandwidth of the content of audio waveform 206 being played.

In one or more embodiments, anti-resonance filter 210 has a unity gain for each frequency except for specific frequency spectra that are expected to exceed an acoustic limit. The anti-resonance filter 210 attenuates those specific frequency spectra to be equal to or less than the acoustic limit. The resulting filtered audio signal is then processed by A-weighting optimizer 212. A-weighting optimizer 212 can also address available excursion, maximum volume, and thermal limits of transducer(s) 104 (FIG. 1) in producing a wet audio waveform or signal 214.

A-weighting can be used to model the effects of the intended recipient. The human ear responds more to frequencies between 500 Hz and 8 kHz and is less sensitive to very low-pitch or high-pitch noises. The frequency weightings used in sound level meters are often related to the response of the human ear, to ensure that the meter is measuring what a human would hear. The most common weighting that is used in noise measurement is A-Weighting. Like the human ear, this weighting method effectively cuts off the lower and higher frequencies that the average person cannot hear. A-weighting is defined in the sound level meter standards: IEC 60651, IEC 60804, IEC 61672, and ANSI S1.4. In one or more embodiments, C-weighting can be used in order to compensate for sound level since the response of the human ear varies with the sound level. At higher levels, 100 dB and above, the ear's response is flatter than A-weighting. Thus, a combination of A-weighting and C-weighting can be used as a function of sound level.

In one or more embodiments, based on the use case mapping information 204, acoustic control system 200 triggers a safety timer 216 that controls a wet/dry mix component 218. Synchronization component 220 performs a time-alignment with the wet audio waveform 214 by delaying and buffering the dry audio waveform 206. In one or more embodiments, the wet/dry mixing of the dry and wet audio waveforms 206, 214 is performed according to a linear function $\alpha(t)$ that changes from 0 to 1 over a preset period of time such as 3 seconds. Thus, a wet audio waveform amplifier 222 has a gain: 1—α(t) that ramps down the contribution of the wet audio waveform 214 in correspondence to a dry audio waveform amplifier 224 with a gain function, α(t), that are combined at a mixer 226. A resulting wet/dry mix 228 can then be processed by an audio coder-decoder (CODEC) and output amplifier 230 for driving transducer(s) 104 (FIG. 1). In one or more embodiments, a gain function α(t) can be a nonlinear function rather than linear in approaching a steady-state condition. The time-dependent function α(t) holds the loudness at a level that is below an acoustic output limit of 13 N while optimizing maximum available loudness based on considerations of temperature, excursion, drive voltage, and headroom available when the electronic device 100 (FIG. 1) is ear-coupled.

Figure 3:
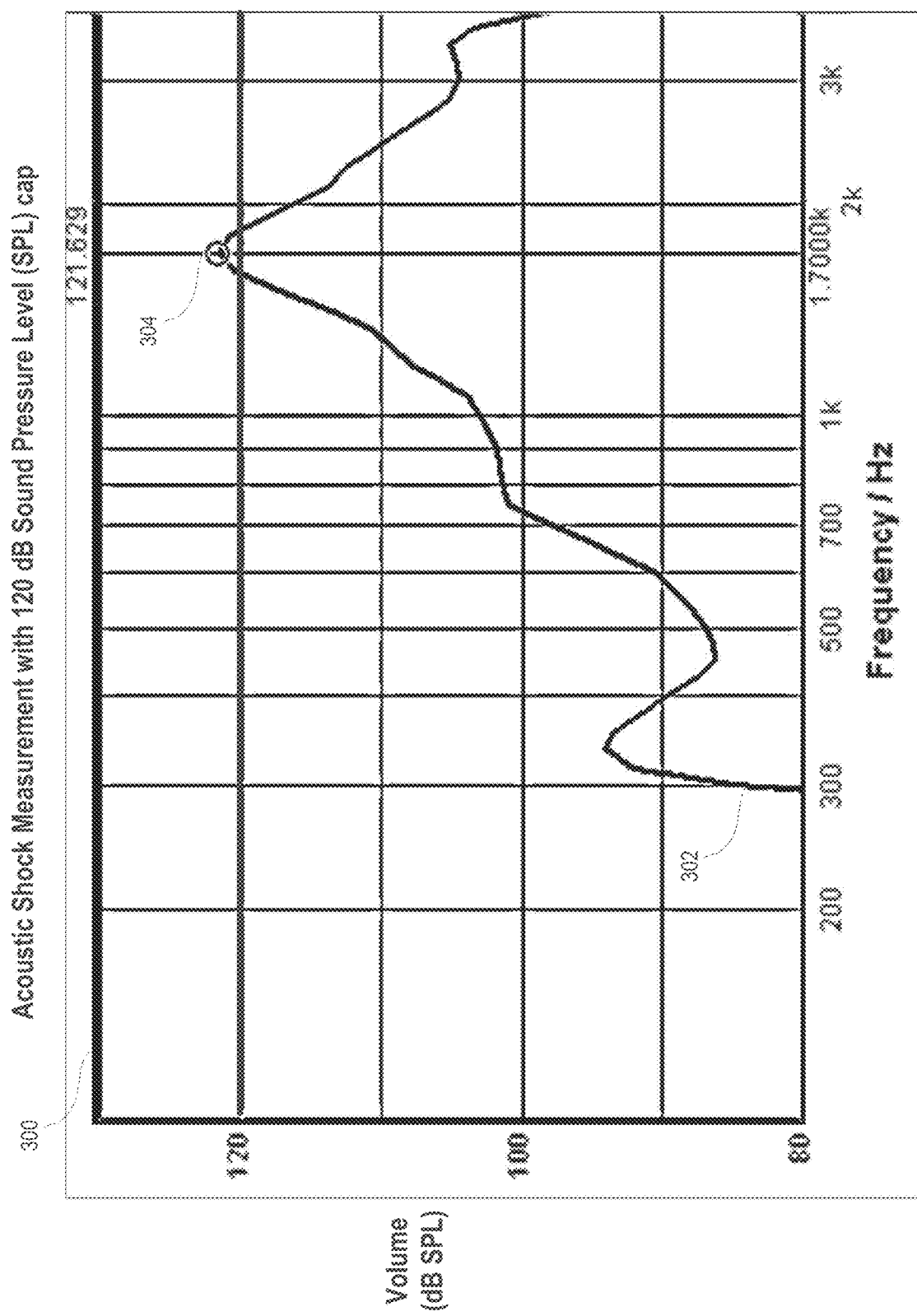
FIG. 3 provides a graphical plot depiction illustrating volume versus frequency for an example acoustic shock measurement, according to one or more embodiments.
Figure 4:
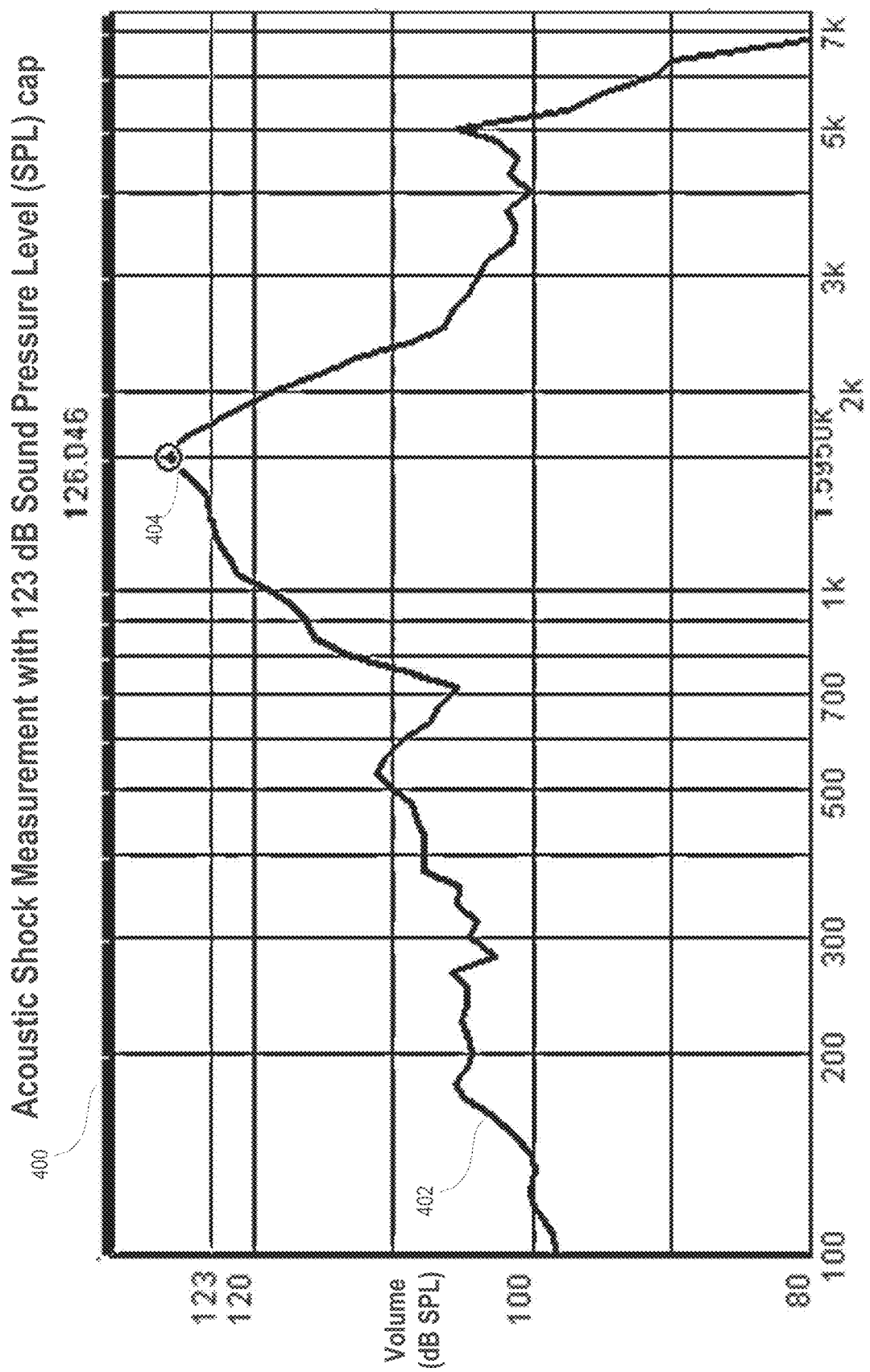
FIG. 4 provides a graphical plot depiction illustrating volume versus frequency for another example acoustic shock measurement, according to one or more embodiments.

FIG. 3 illustrates a graphical depiction 300 of volume versus frequency plot 302 for an example acoustic shock measurement, according to one or more embodiments. Frequency spectra 304 of about 121.629 Hz exceed a 120 dB sound pressure level (SPL) limit. FIG. 4 illustrates a graphical depiction 400 of volume versus frequency plot 402 for another example acoustic shock measurement, according to one or more embodiments. Frequency spectra 404 of about 126.046 Hz exceed a 123 dB sound pressure level (SPL) limit. Frequency spectra 304, 404 differ because different ear canal resonances exist between different user devices 100 (FIG. 1). No single family of filter shapes or curves would thus be appropriate across such differences.

Figure 5:
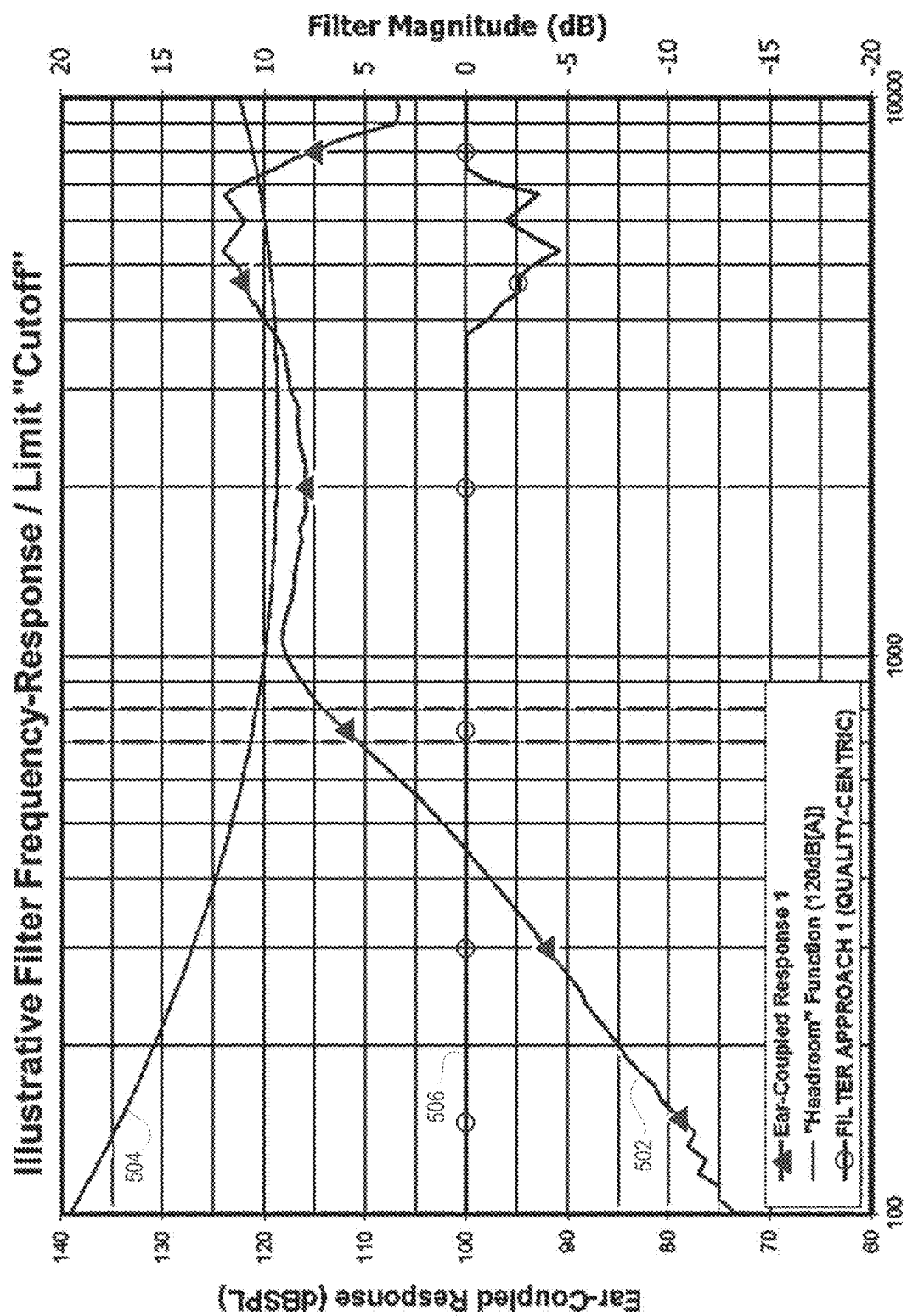
FIG. 5 provides a graphical plot depiction illustrating volume versus frequency plots for an ear coupled response, headroom function and a quality-centric filter approach, according to one or more embodiments.

FIG. 5 illustrates a graphical depiction 500 of volume versus frequency plots 502, 504, 506 of a quality-centric filter approach, according to one or more embodiments. Plot 502 provides an ear coupled response that is expected from an audio signal. Based on resonance response by an ear canal, plot 504 provides a frequency-dependent acoustic output limit or "headroom". Plot 504 is lower in a midrange portion where the ear canal allows more of the sound pressure to penetrate. Plot 506 is customized for the particular audio signal and ear coupled response to remain within the headroom of plot 504. For the quality-centric approach, plot 506 provides a unity gain for those frequency spectra where plot 502 remains below plot 504. For those frequency spectra of plot 502 that exceed plot 504, an attenuated gain of less than unity is provided by plot 506, so a resulting filtered audio signal is equal to the available headroom as provided by plot 504.

Figure 6:
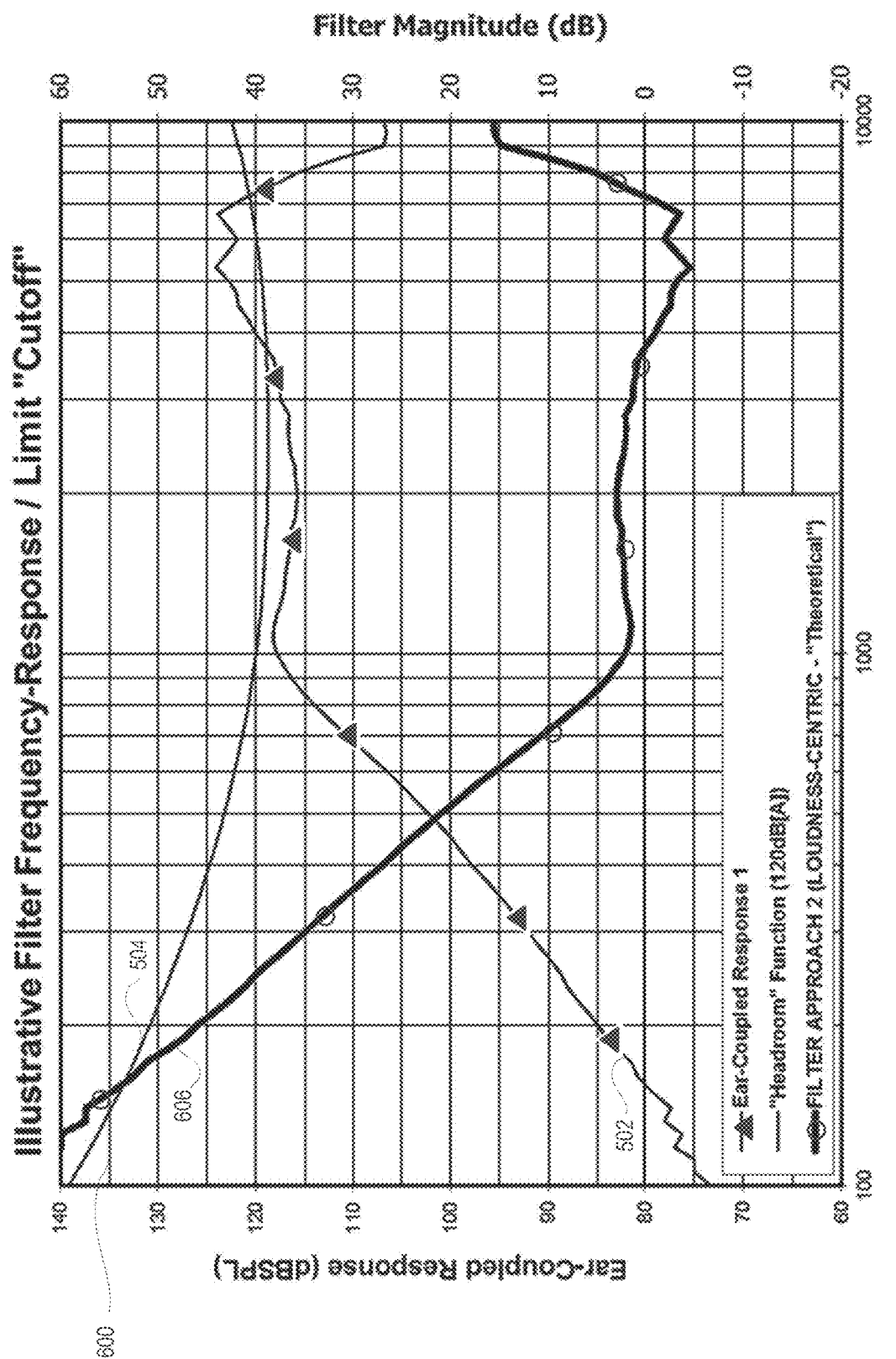
FIG. 6 provides a graphical plot depiction illustrating volume versus frequency plots for an ear coupled response, headroom function, and a theoretical loudness-centric filter approach, according to one or more embodiments.

FIG. 6 illustrates a graphical depiction 600 of volume versus frequency plots 502, 504, 606 of a theoretical loudness-centric filter approach, according to one or more embodiments. Plot 502 provides an ear coupled response that is expected from an audio signal. Based on resonance response by an ear canal, plot 504 provides a frequency-dependent acoustic output limit or "headroom". Plot 504 is lower in a midrange portion where the ear canal allows more of the sound pressure to penetrate. Plot 606 is customized for the particular audio signal and ear coupled response to remain within the headroom of plot 504. For clarity, a filter shape provided by plot 606 is theoretically possible for an audio system that has been designed without typical hardware limitations. For example, having 60 dB of clean gain is not an assumed characteristics of most audio systems. For the theoretical loudness-centric approach, plot 606 provides an amplified gain of more than unity for those frequency spectra where plot 602 remains below plot 604. For those frequency spectra of plot 602 that exceed plot 604, an attenuated gain of less than unity is provided by plot 606. A resulting filtered audio signal is thus equal to the available headroom as provided by plot 504 across the full frequency band.

Figure 7:
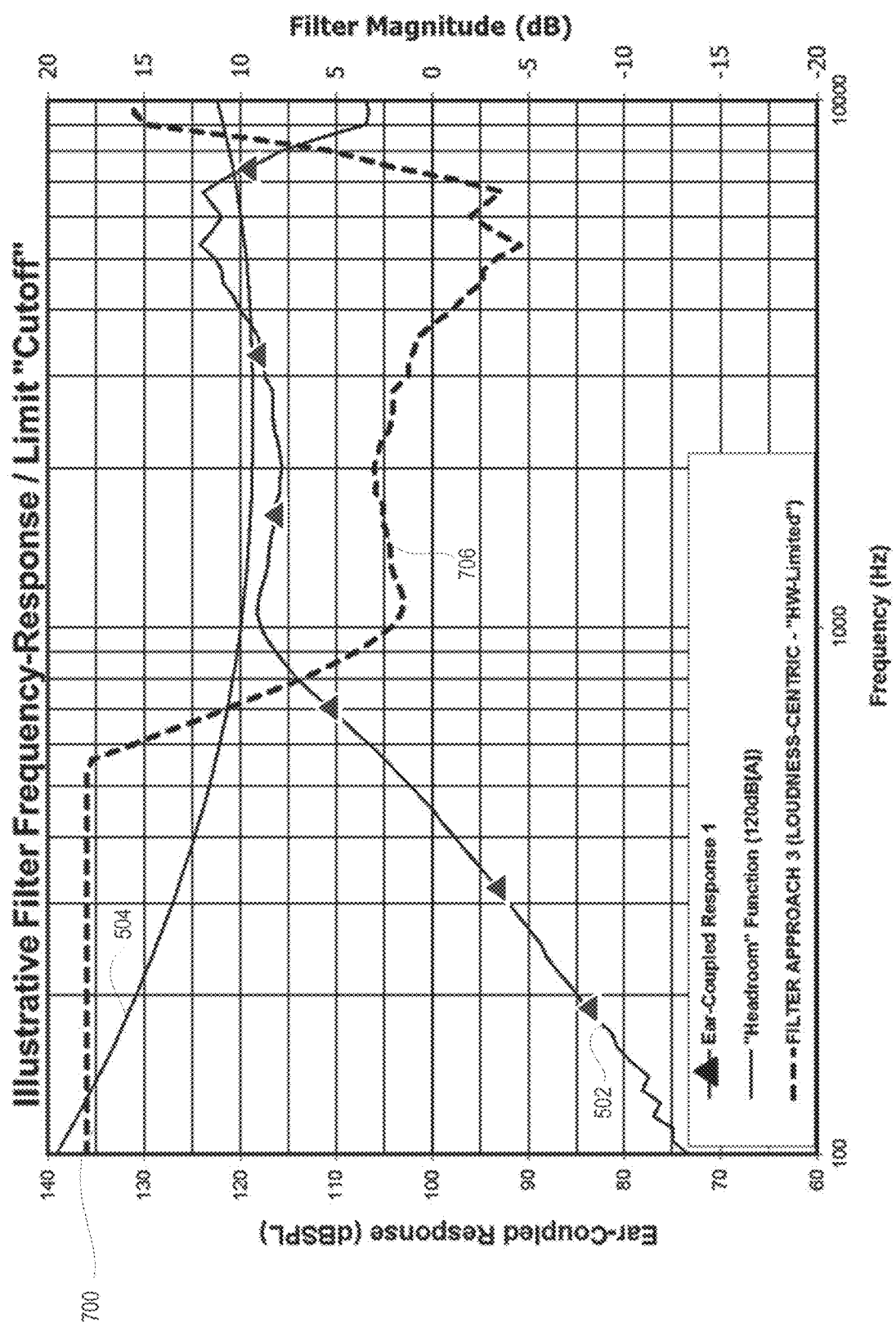
FIG. 7 provides a graphical plot depiction illustrating volume versus frequency plots for an ear coupled response, headroom function, and a hardware-limited, loudness-centric filter approach, according to one or more embodiments.

FIG. 7 illustrates a graphical depiction 700 of volume versus frequency plots 502, 504, 706 of a hardware-limited loudness-centric filter approach, according to one or more embodiments. Plot 502 provides an ear coupled response that is expected from an audio signal. Based on resonance response by an ear canal, plot 504 provides a frequency-dependent acoustic output limit or "headroom". Plot 504 is lower in a midrange portion where the ear canal allows more of the sound pressure to penetrate. Plot 706 is customized for the particular audio signal and ear coupled response to remain within the headroom of plot 504. For clarity, a filter shape provided by plot 706 that takes into account that most hardware-limited audio system designs have a saturation value or maximum total end-to-end gain available such as 18 dB for the filter magnitude. For the hardware-limited loudness-centric approach, plot 706 provides an amplified gain of more than unity for those frequency spectra where plot 702 remains below plot 704. The amplified gain is limited by the saturation value. For those frequency spectra of plot 702 that exceed plot 704, an attenuated gain of less than unity is provided by plot 706. A resulting filtered audio signal is thus equal to the available headroom as provided by plot 504 across the full frequency band except where the available headroom was greater than the saturation value. Those portions have improved loudness but would not reach the headroom provided by plot 504.

For each of the plots 506, 606, 706 of FIGS. 5-7, the filter shape prevents the acoustic output exceeding an acoustic output limit but also avoids unnecessarily reducing the gain of the entire audio signal. User experience is improved by avoiding a distracting reduction in perceived loudness of the overall acoustic output.

Figure 8:
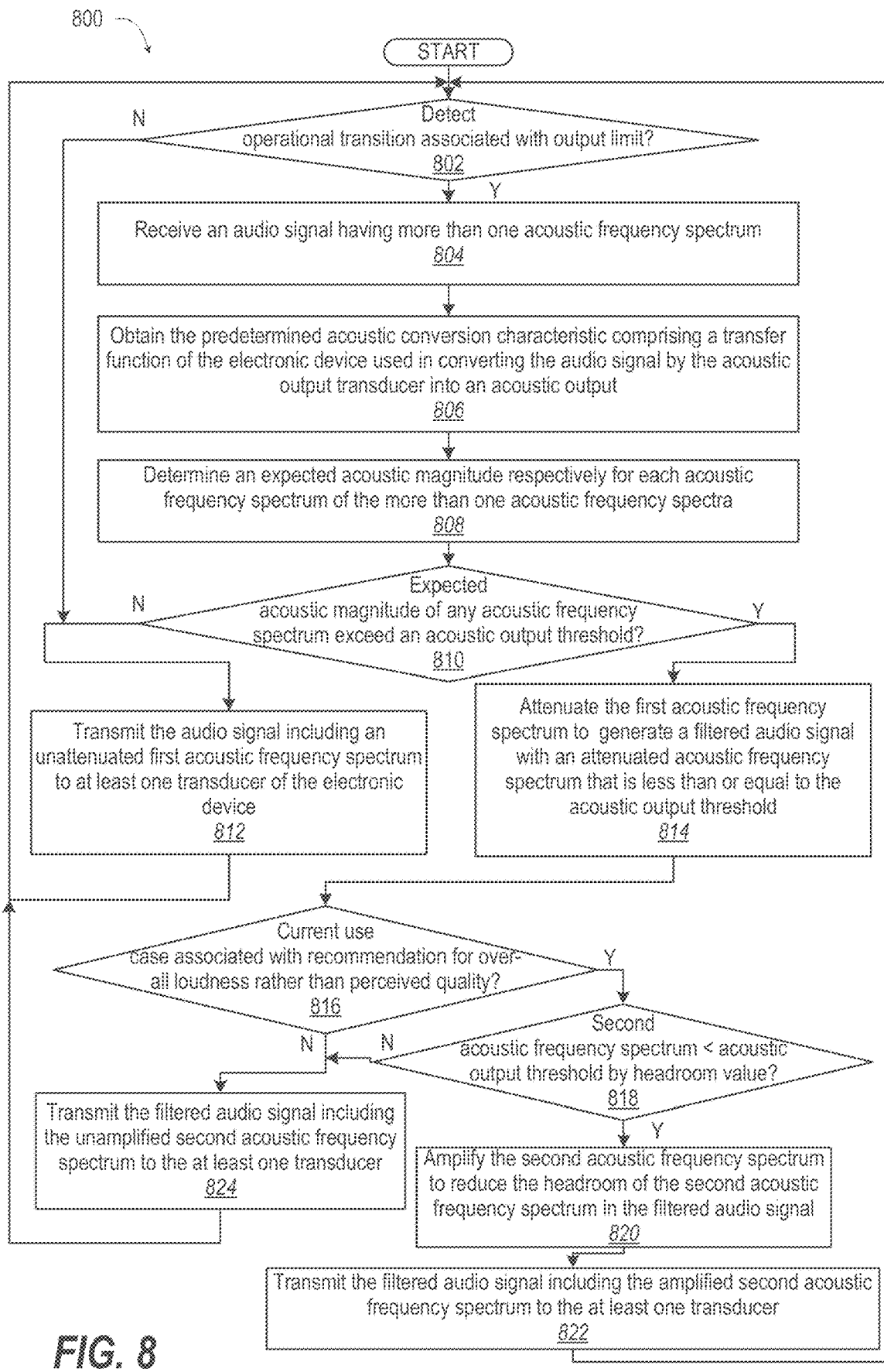
FIG. 8 provides a flow diagram illustrating a method of acoustic limiting of an audio output of an electronic device using a feed-forward, filter-based, acoustic control system, according to one or more embodiments.

FIG. 8 illustrates a method 800 of acoustic limiting of an audio output of an electronic device using a feed-forward, filter-based, acoustic control system. Method 800 begins at start block and proceeds to decision block 802 with an acoustic controller 102 (FIG. 1) determining whether an operational transition is detected that is associated with an output limit. In response to detecting an operational transition that is associated with an output limit, method 800 includes receiving an audio signal having more than one acoustic frequency spectrum (block 804). In one or more embodiments, method 800 includes obtaining the predetermined acoustic conversion characteristic comprising a transfer function of the electronic device used in converting the audio signal by the acoustic output transducer into an acoustic output (block 806). Acoustic controller 102 (FIG. 1) determines an expected acoustic magnitude respectively for each acoustic frequency spectrum of the more than one acoustic frequency spectra (block 808). Acoustic controller 102 (FIG. 1) determines whether the expected acoustic magnitude of any of the more than one acoustic frequency spectra will exceed an acoustic output threshold (decision block 810). In response to determining that a first acoustic frequency spectrum of the more than one acoustic frequency spectra will not exceed the acoustic output threshold, method 800 includes transmitting the audio signal including an unattenuated first acoustic frequency spectrum to at least one transducer of the electronic device (block 812). Then method 800 returns to block 802 to continue performing acoustic control of the audio signal. In response to determining that a first acoustic frequency spectrum of the more than one acoustic frequency spectra will exceed the acoustic output threshold, method 800 includes attenuating the first acoustic frequency spectrum to generate a filtered audio signal with an attenuated acoustic frequency spectrum that is less than or equal to the acoustic output threshold (block 814).

Acoustic controller 102 (FIG. 1) determines whether a current use case exists that is associated with a recommendation for overall loudness rather than perceived quality (decision block 816). In response to determining the current use case exists that is associated with a recommendation for overall loudness, method 800 includes determining whether a second acoustic frequency spectrum of the more than one acoustic frequency spectra will be less than the acoustic output threshold by a headroom value (decision block 818). In response to determining that the second acoustic frequency spectrum will be less than the acoustic output threshold by the headroom value, acoustic controller 102 (FIG. 1) amplifies the second acoustic frequency spectrum to reduce the headroom of the second acoustic frequency spectrum in the filtered audio signal, thereby increasing the overall loudness of the audio output without exceeding the audio limit at a particular frequency spectrum (block 820). Then method 800 returns to block 802 to continue performing acoustic control of the audio signal.

In response to determining that the current use case associated with a recommendation for overall loudness does not exist, i.e., the use case for perceived quality is determined in decision block 814, method 800 includes transmitting the filtered audio signal including the unamplified second acoustic frequency spectrum to the at least one transducer (block 822). Then method 800 returns to block 802 to continue performing acoustic control of the audio signal.

In response to determining that the second acoustic frequency spectrum of the more than one acoustic frequency spectra will not be less than the acoustic output threshold by the headroom value in decision block 816, method 800 proceeds to block 822 to transmit the second acoustic frequency spectrum of the filtered audio signal to the at least one transducer of the electronic device. The second acoustic frequency spectrum is transmitted unamplified. Then method 800 returns to block 802 to continue performing acoustic control of the audio signal.

In response to determining that an operational transition that is associated with an output limit is not detected in decision block 802, the acoustic controller proceeds to block 812 to transmit the audio signal including an unattenuated first acoustic frequency spectrum to the at least one transducer of the electronic device. Then method 800 returns to block 802 to continue performing acoustic control of the audio signal.

Figure 9:
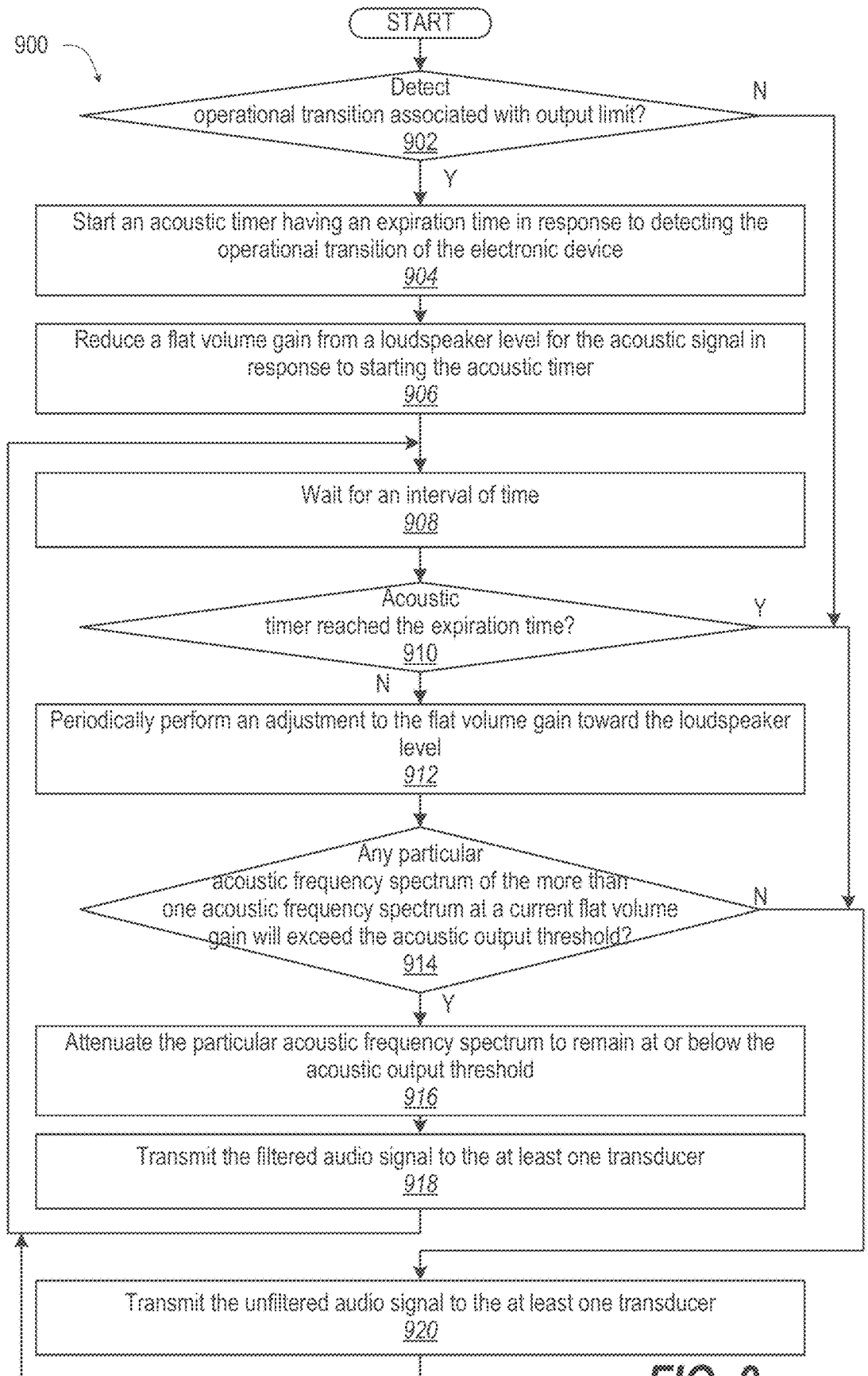
FIG. 9 provides a flow diagram illustrating a method of filtering an audio signal to the at least one transducer of an electronic device during a transition period when an audio output limit is warranted, according to one or more embodiments.

FIG. 9 illustrates a method 900 of filtering an audio signal to the at least one transducer of an electronic device during a transition period when an audio output limit is warranted. In one or more embodiments, method 900 begins at start block and proceeds to decision block 902 with an acoustic controller 102 (FIG. 1) determining whether an operational transition is detected that is associated with an output limit. Examples of an applicable operational transition of the electronic device include: (i) earpiece mode to loudspeaker mode; (ii) addition of an auditory alert; and (iii) a communication mode to an audio playback mode. In response to determining that the operational transition is detected that is associated with the output limit, method 900 includes starting an acoustic timer in response to detecting the operational transition of the electronic device, the acoustic timer having an expiration time (block 904). Acoustic controller 102 (FIG. 1) reduces a flat volume gain from a loudspeaker level for the acoustic signal in response to starting the acoustic timer (block 906). Method 900 includes waiting for an interval of time (block 908). The interval can be short relative to the duration of a length of the expiration time and relative to human auditory perception. Acoustic controller 102 (FIG. 1) determines whether the acoustic timer has reached the expiration time (decision block 910). In response to determining that the acoustic timer has not reached the expiration time, method 900 includes incrementally or periodically performing an adjustment to the flat volume gain toward the loudspeaker level (block 912). A determination is made whether any particular acoustic frequency spectra of the more than one acoustic frequency spectra at a current flat volume gain will exceed the acoustic output threshold (decision block 914). In response to determining that the particular acoustic frequency spectra exceeds the acoustic output threshold, method 900 includes attenuating the particular acoustic frequency spectra to remain at or below the acoustic output threshold (block 916). Acoustic controller 102 (FIG. 1) transmits the filtered audio signal to the at least one transducer of the electronic device (block 918). Method 900 returns to block 908 to continue adjusting the flat volume gain during the transition period. In response to determining that no particular acoustic frequency spectra exceeds the acoustic output threshold in decision block 914, method 900 includes transmitting the unfiltered audio signal to the at least one transducer (block 920). Method 900 returns to block 908 to continue adjusting the flat volume gain during the transition period. In response to determining that the acoustic timer has reached the expiration time in decision block 910, acoustic controller 102 (FIG. 1) proceeds to block 920 to transmit unattenuated the first acoustic frequency spectrum to the at least one transducer.

Previous attempts to limit the acoustic output level of user devices has included sensing proximity of a user; However, such sensing can miss instances in which a lower audio output level is warranted or can inappropriately impose such a limitation when not required. As an alternative approach, some generally-known user devices automatically reduce an input volume level of the audio signal when a particular transition from an earpiece mode to a loudspeaker mode is detected. Such a feed-forward, straight gain has a flat response across the frequency audio spectrum regardless of the actual audio output of the device. Throttling the loudness of the electronic device reflexively can be extremely detrimental to the user experience during the transition period when the loudness is throttled. Method 900 can include and improve upon these features. For example, the amount of overall volume reduction need not be as great to prevent any excursions above the threshold. Feed forward processing based on expected actual output magnitudes per frequency spectra are used to clip as required.

In each of the above flow charts presented herein, certain steps of the methods can be combined, performed simultaneously or in a different order, or perhaps omitted, without deviating from the spirit and scope of the described innovation. While the method steps are described and illustrated in a particular sequence, use of a specific sequence of steps is not meant to imply any limitations on the innovation. Changes may be made with regards to the sequence of steps without departing from the spirit or scope of the present innovation. Use of a particular sequence is therefore, not to be taken in a limiting sense, and the scope of the present innovation is defined only by the appended claims.

As will be appreciated by one skilled in the art, embodiments of the present innovation may be embodied as a system, device, and/or method. Accordingly, embodiments of the present innovation may take the form of an entirely hardware embodiment or an embodiment combining software and hardware embodiments that may all generally be referred to herein as a "circuit," "module" or "system."

Aspects of the present innovation are described above with reference to flowchart illustrations and/or block diagrams of methods, apparatus (systems) and computer program products according to embodiments of the innovation. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

While the innovation has been described with reference to exemplary embodiments, it will be understood by those skilled in the art that various changes may be made and equivalents may be substituted for elements thereof without departing from the scope of the innovation. In addition, many modifications may be made to adapt a particular system, device or component thereof to the teachings of the innovation without departing from the essential scope thereof. Therefore, it is intended that the innovation not be limited to the particular embodiments disclosed for carrying out this innovation, but that the innovation will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the innovation. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present innovation has been presented for purposes of illustration and description, but is not intended to be exhaustive or limited to the innovation in the form disclosed. Many modifications and variations will be apparent to those of ordinary skill in the art without departing from the scope and spirit of the innovation. The embodiment was chosen and described in order to best explain the principles of the innovation and the practical application, and to enable others of ordinary skill in the art to understand the innovation for various embodiments with various modifications as are suited to the particular use contemplated.

What is claimed is:

1. A method comprising:
receiving an audio signal having more than one acoustic frequency spectra;
determining an acoustic magnitude respectively for each acoustic frequency spectrum of the more than one acoustic frequency spectra;
determining whether the acoustic magnitude of a first acoustic frequency spectrum of the more than one acoustic frequency spectra will be less than the acoustic output threshold by a headroom value;
in response to determining that the acoustic magnitude of the first acoustic frequency spectrum of the more than one acoustic frequency spectra will be less than the acoustic output threshold by the headroom value, amplifying the first acoustic frequency spectrum to reduce a headroom of the first acoustic frequency spectrum in the filtered audio signal;
determining whether a current use case exists that is associated with a recommendation for overall loudness rather than perceived quality;
in response to determining the current use case exists that is associated with the recommendation for overall loudness:
  determining whether the acoustic magnitude of a second acoustic frequency spectrum of the more than one acoustic frequency spectra will be less than the acoustic output threshold by a headroom value; and
  in response to determining that the acoustic magnitude of the second acoustic frequency spectrum of the more than one acoustic frequency spectra will be less than the acoustic output threshold by the headroom value, amplifying the second acoustic frequency spectrum to reduce a headroom of the second acoustic frequency spectrum in the filtered audio signal; and
transmitting the filtered audio signal to at least one transducer of the electronic device.

2. The method of claim 1, further comprising:
determining the expected acoustic magnitude based on the audio signal and a predetermined acoustic conversion characteristic of the at least one transducer that comprises a transfer function of the device used in converting the audio signal by the transducer into an acoustic output;
determining whether the expected acoustic magnitude of any of the more than one acoustic frequency spectra will exceed an acoustic output threshold; and
in response to determining that an acoustic magnitude of a first acoustic frequency spectrum of the more than one acoustic frequency spectra will exceed the acoustic output threshold, attenuating the first acoustic frequency spectrum to generate a filtered audio signal with an attenuated acoustic frequency spectrum that is less than or equal to the acoustic output threshold.

3. The method of claim 1, further comprising:
detecting an operational transition of the electronic device from a selected one of: (i) earpiece mode to loudspeaker mode; (ii) addition of an auditory alert; and (iii) a communication mode to an audio playback mode; and
performing the attenuating of the first acoustic frequency spectrum in response to detecting the operational transition.

4. The method of claim 3, further comprising:
in response to detecting the operational transition of the device from earpiece mode to loudspeaker mode, starting an acoustic timer, the acoustic timer having an expiration time; and
wherein performing the attenuating of the first acoustic frequency spectrum comprises:

incrementally adjusting the attenuation of the first acoustic frequency spectrum until the acoustic timer reaches the expiration time; and in response to determining that the acoustic timer has reached the expiration time prior to performing an attenuation of the first acoustic frequency spectrum, transmitting un-attenuated an original audio signal with the first acoustic frequency spectrum to the at least one transducer.

5. The method of claim 1, further comprising:

in response to detecting the operational transition of the device from earpiece mode to loudspeaker mode, starting an acoustic timer, the acoustic timer having an expiration time;

in response to starting the acoustic timer, reducing a flat volume gain from a loudspeaker level for the acoustic signal; and in response to determining that the acoustic timer has not reached the expiration time:

incrementally performing an adjustment to the flat volume gain toward the loudspeaker level;

determining whether any particular acoustic frequency spectra of the more than one acoustic frequency spectra at a current flat volume gain will exceed the acoustic output threshold; and in response to determining that the particular acoustic frequency spectra exceeds the acoustic output threshold, attenuating the particular acoustic frequency spectra to remain at or below the acoustic output threshold.

6. The method of claim 1, wherein amplifying the first acoustic frequency spectrum to reduce the headroom of the first acoustic frequency spectrum in the filtered audio signal increases an overall loudness of the audio output without exceeding the audio limit at a particular frequency spectrum.

7. The method of claim 1, wherein the headroom value is a frequency-dependent acoustic output limit based on resonance response of an ear canal.

8. An electronic device comprising:

at least one transducer;

a memory containing an acoustic utility and an audio application that produces an audio signal; and a processor subsystem in communication with the memory and the at least one transducer and which executes the audio application and the acoustic utility, which causes the processor sub system to:

receive an audio signal having more than one acoustic frequency spectra;

determine an acoustic magnitude respectively for each acoustic frequency spectrum of the more than one acoustic frequency spectra;

determine whether the acoustic magnitude of a first acoustic frequency spectrum of the more than one acoustic frequency spectra will be less than the acoustic output threshold by a headroom value;

in response to determining that the first acoustic frequency spectrum of the more than one acoustic frequency spectra will be less than the acoustic output threshold by the headroom value, amplify the first acoustic frequency spectrum to reduce a headroom of the first acoustic frequency spectrum in the filtered audio signal;

determine whether a current use case exists that is associated with a recommendation for overall loudness rather than perceived quality;

in response to determining the current use case exists that is associated with the recommendation for overall loudness:

determine whether the acoustic magnitude of a second acoustic frequency spectrum of the more than one acoustic frequency spectra will be less than the acoustic output threshold by a headroom value; and in response to determining that the second acoustic frequency spectrum of the more than one acoustic frequency spectra will be less than the acoustic output threshold by the headroom value, amplify the second acoustic frequency spectrum to reduce a headroom of the first acoustic frequency spectrum in the filtered audio signal; and transmit the filtered audio signal to the at least one transducer of the electronic device.

9. The electronic device of claim 7, wherein the processor subsystem further:

determines the expected acoustic magnitude based on the audio signal and a predetermined acoustic conversion characteristic of the at least one transducer that comprises a transfer function of the electronic device used in converting the audio signal by the at least one transducer into an acoustic output;

determines whether the expected acoustic magnitude of any of the more than one acoustic frequency spectra will exceed an acoustic output threshold; and in response to determining that an acoustic magnitude of a first acoustic frequency spectrum of the more than one acoustic frequency spectra will exceed the acoustic output threshold, attenuate the first acoustic frequency spectrum to generate a filtered audio signal with an attenuated acoustic frequency spectrum that is less than or equal to the acoustic output threshold.

10. The electronic device of claim 8, wherein the processor subsystem:

detects an operational transition of the electronic device from a selected one of: (i) earpiece mode to loudspeaker mode; (ii) addition of an auditory alert; and (iii) a communication mode to an audio playback mode; and attenuates the first acoustic frequency spectrum in response to detecting an operational transition of the electronic device from earpiece mode to loudspeaker mode.

11. The electronic device of claim 10, wherein, the processor subsystem:

in response to detecting the operational transition of the electronic device from earpiece mode to loudspeaker mode, starts an acoustic timer, the acoustic timer having an expiration time; and wherein performing the attenuating of the first acoustic frequency spectrum comprises:

incrementally adjusting the attenuation of the first acoustic frequency spectrum until the acoustic timer reaches the expiration time; and in response to determining that the acoustic timer has reached the expiration time prior to performing an incremental attenuation of the first acoustic frequency spectrum, transmitting un-attenuated an original audio signal with the first acoustic frequency spectrum to the at least one transducer.

12. The electronic device of claim 8, wherein the processor subsystem:

in response to detecting the operational transition of the electronic device from earpiece mode to loudspeaker mode, starts an acoustic timer, the acoustic timer having an expiration time;
reduces a flat volume gain from a loudspeaker level for the acoustic signal in response to starting the acoustic timer; and
in response to determining that the acoustic timer has not reached the expiration time:
incrementally perform an adjustment to the flat volume gain toward the loudspeaker level;
determines whether any particular acoustic frequency spectra of the more than one acoustic frequency spectra at a current flat volume gain will exceed the acoustic output threshold; and
in response to determining that the particular acoustic frequency spectra exceeds the acoustic output threshold, attenuates the particular acoustic frequency spectra to remain at or below the acoustic output threshold.

13. The electronic device of claim 8, wherein the headroom value is a frequency-dependent acoustic output limit based on resonance response of an ear canal.

14. A computer program product comprising:
a non-transitory computer readable storage device; and
program code on the computer readable storage device that when executed by a processor associated with an electronic device, the program code enables the electronic device to provide the functionality of:
receiving an audio signal having more than one acoustic frequency spectra;
determining an expected acoustic magnitude respectively for each acoustic frequency spectrum of the more than one acoustic frequency spectra;
determining whether the acoustic magnitude of a first acoustic frequency spectrum of the more than one acoustic frequency spectra will be less than the acoustic output threshold by a headroom value;
in response to determining that the acoustic magnitude of the first acoustic frequency spectrum of the more than one acoustic frequency spectra will be less than the acoustic output threshold by the headroom value, amplifying the first acoustic frequency spectrum to reduce a headroom of the first acoustic frequency spectrum in the filtered audio signal;
determining whether a current use case exists that is associated with a recommendation for overall loudness rather than perceived quality;
in response to determining the current use case exists that is associated with the recommendation for overall loudness:
determining whether the acoustic magnitude of a second acoustic frequency spectrum of the more than one acoustic frequency spectra will be less than the acoustic output threshold by a headroom value; and
in response to determining that the acoustic magnitude of the second acoustic frequency spectrum of the more than one acoustic frequency spectra will be less than the acoustic output threshold by the headroom value, amplifying the second acoustic frequency spectrum to reduce a headroom of the second acoustic frequency spectrum in the filtered audio signal; and
transmitting the filtered audio signal to the at least one transducer of the electronic device.

15. The computer program product of claim 14, further comprising program code for:
determining the expected acoustic magnitude based on the audio signal and a predetermined acoustic conversion characteristic of the at least one transducer that comprises a transfer function of the electronic device used in converting the audio signal by the at least one transducer into an acoustic output;
determining whether the expected acoustic magnitude of any of the more than one acoustic frequency spectra will exceed an acoustic output threshold resulting in a filtered audio signal; and
in response to determining that an acoustic magnitude of a first acoustic frequency spectrum of the more than one acoustic frequency spectra will exceed the acoustic output threshold, attenuating the first acoustic frequency spectrum to generate a filtered audio signal with an attenuated acoustic frequency spectrum that is less than or equal to the acoustic output threshold.

16. The computer program product of claim 14, further comprising program code for:
detecting an operational transition of the electronic device from a selected one of: (i) earpiece mode to loudspeaker mode; (ii) addition of an auditory alert; and (iii) a communication mode to an audio playback mode; and
attenuating the first acoustic frequency spectrum in response to detecting an operational transition of the electronic device from earpiece mode to loudspeaker mode.

17. The computer program product of claim 16, wherein the program code enables the electronic device to provide the functionality of:
in response to detecting the operational transition of the device from earpiece mode to loudspeaker mode, starting an acoustic timer, the acoustic timer having an expiration time; and
wherein performing the attenuating of the first acoustic frequency spectrum comprises:
incrementally adjusting the attenuation of the first acoustic frequency spectrum until the acoustic timer reaches the expiration time; and
in response to determining that the acoustic timer has reached the expiration time prior to performing an attenuation of the first acoustic frequency spectrum, transmitting un-attenuated an original audio signal with the first acoustic frequency spectrum to the at least one transducer.

18. The computer program product of claim 16, wherein the program code enables the electronic device to provide the functionality of:
in response to detecting the operational transition of the device from earpiece mode to loudspeaker mode, starting an acoustic timer, the acoustic timer having an expiration time;
reducing a flat volume gain from a loudspeaker level for the acoustic signal in response to starting the acoustic timer; and
in response to determining that the acoustic timer has not reached the expiration time:
incrementally performing an adjustment to the flat volume gain toward the loudspeaker level;
determining whether any particular acoustic frequency spectra of the more than one acoustic frequency spectra at a current flat volume gain will exceed the acoustic output threshold; and
in response to determining that the particular acoustic frequency spectra exceeds the acoustic output threshold, attenuating the particular acoustic frequency spectra to remain at or below the acoustic output threshold.

19. The computer program product of claim 14, wherein the headroom value is a frequency-dependent acoustic output limit based on resonance response of an ear canal.

* * * * *